United States Patent
Matsuzuka et al.

(10) Patent No.: US 8,659,352 B2
(45) Date of Patent: Feb. 25, 2014

(54) POWER AMPLIFIER

(75) Inventors: Takayuki Matsuzuka, Tokyo (JP); Kazuhiro Iyomasa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 12 days.

(21) Appl. No.: 13/601,038

(22) Filed: Aug. 31, 2012

(65) Prior Publication Data

US 2013/0241659 A1    Sep. 19, 2013

(30) Foreign Application Priority Data

Mar. 15, 2012 (JP) .................................. 2012-059034

(51) Int. Cl.
*H03F 1/14* (2006.01)
*H03F 3/68* (2006.01)

(52) U.S. Cl.
USPC ........................................... 330/51; 330/295

(58) Field of Classification Search
USPC ................... 330/51, 124 R, 295, 310
See application file for complete search history.

(56) References Cited

U.S. PATENT DOCUMENTS

| 8,207,790 | B2 * | 6/2012 | Asada et al. | 330/302 |
|---|---|---|---|---|
| 8,519,795 | B2 * | 8/2013 | Watanabe et al. | 330/51 |
| 2004/0251967 | A1 | 12/2004 | Moriwaki et al. | |
| 2005/0189989 | A1 | 9/2005 | Kobayashi et al. | |
| 2010/0127689 | A1 | 5/2010 | Yamamoto et al. | |

FOREIGN PATENT DOCUMENTS

| JP | 2004-343244 A | 12/2004 |
|---|---|---|
| JP | 2005-236692 A | 9/2005 |
| JP | 2010-124408 A | 6/2010 |

* cited by examiner

*Primary Examiner* — Khanh V Nguyen

(74) *Attorney, Agent, or Firm* — Leydig, Voit & Mayer, Ltd.

(57) ABSTRACT

A power amplifier includes: a first amplifying element amplifying an input signal; a second amplifying element amplifying an output signal of the first amplifying element; a third amplifying element amplifying the input signal; a first switch connected between an output of the first amplifying element and an input of second amplifying element; a second switch connected between an output of the first amplifying element and an output of the third amplifying element; a third switch connected between an output of the first amplifying element and an output of the second amplifying element; a reference voltage generating a circuit generating reference voltage; a bias circuit supplying a bias current, based on the reference voltage, to inputs of the first, second, and third amplifying elements; and a control circuit controlling the first, second and third switches and the reference voltage generating circuit.

4 Claims, 7 Drawing Sheets

POWER AMPLIFIER

BACKGROUND OF THE INVENTION

1. Field of the Invention

The present invention mainly relates to a power amplifier for mobile communications such as cellular phones.

2. Background Art

As a power amplifier for cellular phones such as CDMA, GaAs-HBT power amplifiers are widely used (for example, refer to Patent Document 1: Japanese Patent Laid-Open No. 2004-343244). Conventional power amplifiers have been required to input an exterior reference voltage. Since the reference voltage determines the idle current of the power amplifier, it must be strong to the variation of the power voltage, and must be constantly maintained at high accuracy (for example, approximately 2.85±0.1 V).

In recent years, the generation of reference voltage in the power amplifier has been required. In this case, depending on enable signals (digital signals for turning ON/OFF the power amplifier) supplied from the exterior, a reference voltage is generated in the amplifier, and the power amplifier is operated (for example, refer to Patent Document 2: Japanese Patent Laid-Open No. 2010-124408).

SUMMARY OF THE INVENTION

Recently, the efficiency improvement at the time of not only high power operations (ca. 27 dBm), but also at the time of low to middle power operations (ca. less than 18 dBm) has become important. This is because a base station is operated mainly by low to middle power operations in urban areas where base stations are relatively concentrated, and the efficiency improvement in low to middle power operations is important for the talk times of mobile phones. Especially, at the time of low power, further efficiency improvement is required. Since the circuit configuration of the RF section has already optimized, for further efficiency improvement, the consumed current in the control section including the bias circuits must be decreased.

In view of the above-described problems, an object of the present invention is to provide a power amplifier which can improve the efficiency in low output.

According to the present invention, a power amplifier includes: a first amplifying element amplifying an input signal; a second amplifying element amplifying an output signal of the first amplifying element; a third amplifying element amplifying an input signal; a first switch connected between an output of the first amplifying element and an input of second amplifying element; a second switch connected between an output of the first amplifying element and an output of the third amplifying element; a third switch connected between an output of the first amplifying element and an output of the second amplifying element; a reference voltage generating circuit generating reference voltage; a bias circuit supplying a bias current based on the reference voltages to inputs of the first, second, and third amplifying elements; and a control circuit controlling the first, second and third switches and the reference voltage generating circuit, wherein when the control circuit turns the first switch off and turns the second and third switches on, the control circuit stops the reference voltage generating circuit.

The present invention makes it possible to improve the efficiency in low output.

Other and further objects, features and advantages of the invention will appear more fully from the following description.

DETAILED DESCRIPTION OF THE PREFERRED EMBODIMENTS

A power amplifier according to the embodiments of the present invention will be described with reference to the drawings. The same components will be denoted by the same symbols, and the repeated description thereof may be omitted.

First Embodiment

Figure 1:
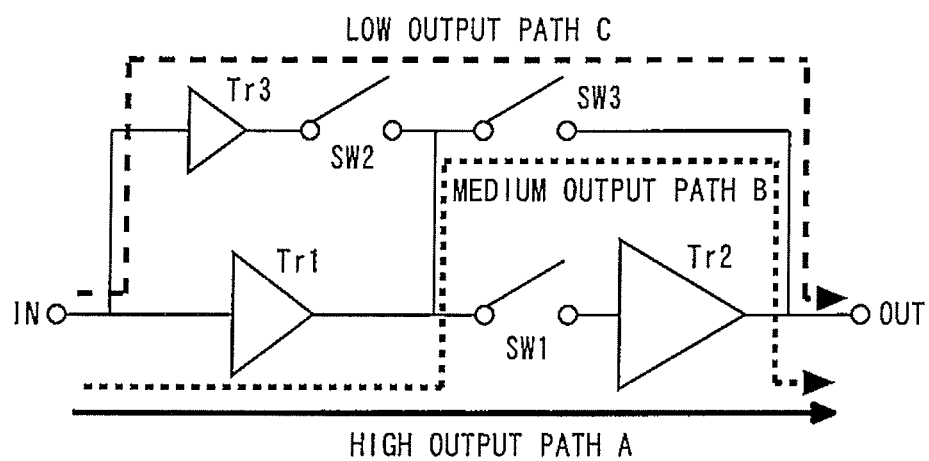
FIG. 1 is a block diagram showing a power amplifier according to a first embodiment of the present invention.
Figure 1:
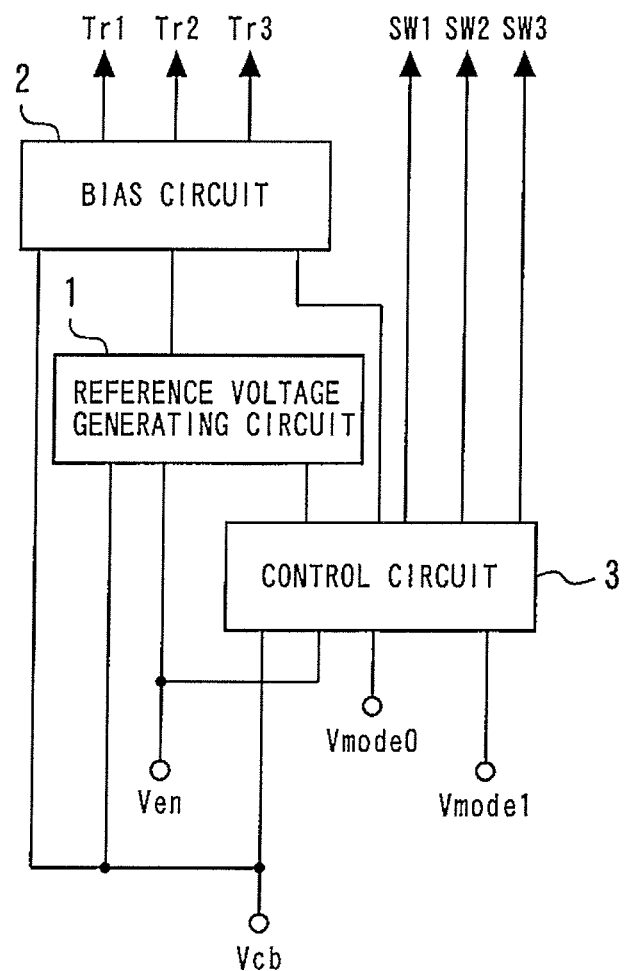

FIG. 1 is a block diagram showing a power amplifier according to a first embodiment of the present invention. An amplifying element Tr1 amplifies input signals inputted from the exterior. An amplifying element Tr2 amplifies output signals of the amplifying element Tr1. An amplifying element Tr3 amplifies input signals. A switch SW1 is connected between the output of the amplifying element Tr1 and the input of the amplifying element Tr2. A switch SW2 is connected between the output of the amplifying element Tr1 and the output of the amplifying element Tr3. A switch SW3 is connected between the output of the amplifying element Tr1 and the output of the amplifying element Tr2.

A reference voltage generating circuit 1 generates reference voltages. A bias circuit 2 supplies a bias current based on the reference voltages to the inputs of the amplifying elements Tr1, Tr2, and Tr3. A control circuit 3 controls the switches SW1, SW2, and SW3, and the reference voltage generating circuit 1. The reference voltage generating circuit 1 and the bias circuit 2 are integrated on the identical GaAs chip using a GaAs system BiFET (HBT+FET) process.

Next, the operation of the power amplifier according to the present embodiment will be described. When a large power output of 17 dBm or more is to be obtained, the control circuit 3 turns the switch SW1 on, the switches SW2 and SW3 off, and a high output path A becomes effective. The amplifying element Tr3 is turned off. Signals inputted to an input terminal IN are amplified by the amplifying element Tr1, the outputted signals from the amplifying element Tr1 are amplified by the amplifying element Tr2, and are outputted from an output terminal OUT.

When a medium power output of 7 to 17 dBm is to be obtained, the control circuit 3 turns the switches SW1 and SW2 off, the switch SW3 on, and a medium output path B becomes effective. The amplifying elements Tr2 and Tr3 are turned off. The signals inputted to the input terminal IN are amplified by the amplifying element Tr1, and are outputted from the output terminal OUT.

When a small power output of 7 dBm or smaller is to be obtained, the control circuit 3 turns the switch SW1 off, the switches SW2 and SW3 on, and a low output path C becomes effective. The amplifying elements Tr1 and Tr2 are turned off. The signals inputted to the input terminal IN are amplified by the amplifying element Tr3, and are outputted from the output terminal OUT. As the feature of the present embodiment, the control circuit 3 stops the reference voltage generating circuit 1 at the time of the low output.

Figure 2:
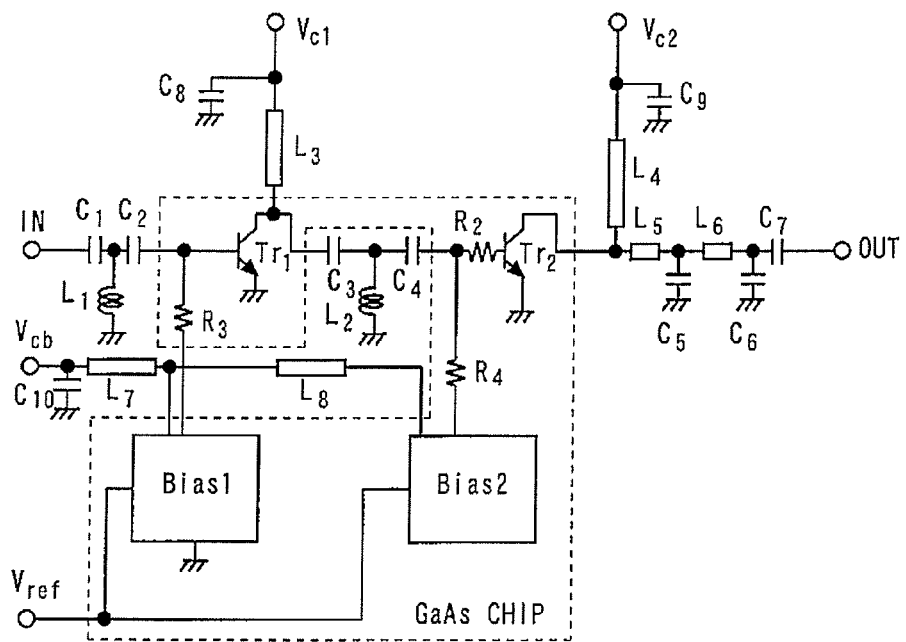
FIG. 2 is a circuit diagram showing a part of the power amplifier according to the first embodiment of the present invention.

FIG. 2 is a circuit diagram showing a part of the power amplifier according to the first embodiment of the present invention. Reference characters Tr3, SW1, SW2, SW3 and the like are omitted. This power amplifier is formed using the BiFET process for forming HBT and FET on the same substrate. A GaAs-HBT power amplifier and a bias circuit are integrated on the same GaAs chip. Those in the frame of the broken line show the GaAs chip, and circuit elements out of the broken line are formed by chip parts and lines on a module substrate.

The amplifying element Tr1 that is the first stage amplifying element to amplify input signals and the amplifying element Tr2 that is the subsequent stage amplifying element to amplify the output signals of the amplifying element Tr1 are formed on the same GaAs substrate. The amplifying elements Tr1 and Tr2 are GaAs-HBTs (Hetero-Junction Bipolar Transistors). Input signals are inputted to the base of the amplifying element Tr1, collector voltage is applied to the collector, and the emitter is grounded. A Bias 1 is a first-stage bias circuit to supply the bias current to the base of the amplifying element Tr1, and a Bias 2 is a subsequent-stage bias circuit to supply the bias current to the base of the amplifying element Tr2.

Reference character IN denotes an RF signal inputting terminal, reference character OUT denotes an RF signal outputting terminal, reference characters R2 to R4 denote resistors, reference characters C1 to C10 denote capacitors, and reference characters L1 and L2 denote inductors. Reference characters L3 to L8 denote lines having a specific electric length, and act as inductors. Reference character Vc denotes a collector power terminal, reference character Vc1 denotes a collector power terminal for the amplifying element Tr1, reference character Vc2 denotes a collector power terminal for the amplifying element Tr2, reference character Vcb denotes a power terminal for the Bias 1 and Bias 2, and reference character Vref denotes a terminal for applying the reference voltages to the Bias 1 and Bias 2.

Figure 3:
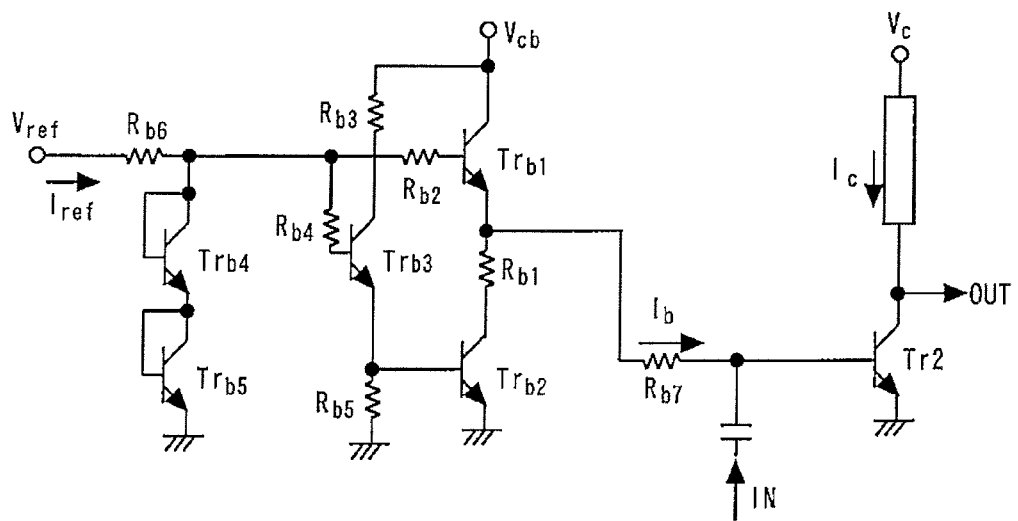
FIG. 3 is a circuit diagram showing a bias circuit according to the first embodiment of the present invention.

FIG. 3 is a circuit diagram showing a bias circuit according to the first embodiment of the present invention. This circuit is an emitter follower type bias circuit corresponding to the above-described Bias 2. The same is applied to the circuit of Bias 1. Reference character Vref denotes a terminal to which the reference voltage is applied, reference characters Trb1 to Trb5 denote GaAs-HBTs, and reference characters Rb1 to Rb7 denote resistors. This bias circuit operates so as to constantly maintain idle currents of the amplifying elements Tr1 and Tr2 to change in temperature. Here, "idle current" means the bias current of the power amplifier when no RF input power is present.

Figure 4:
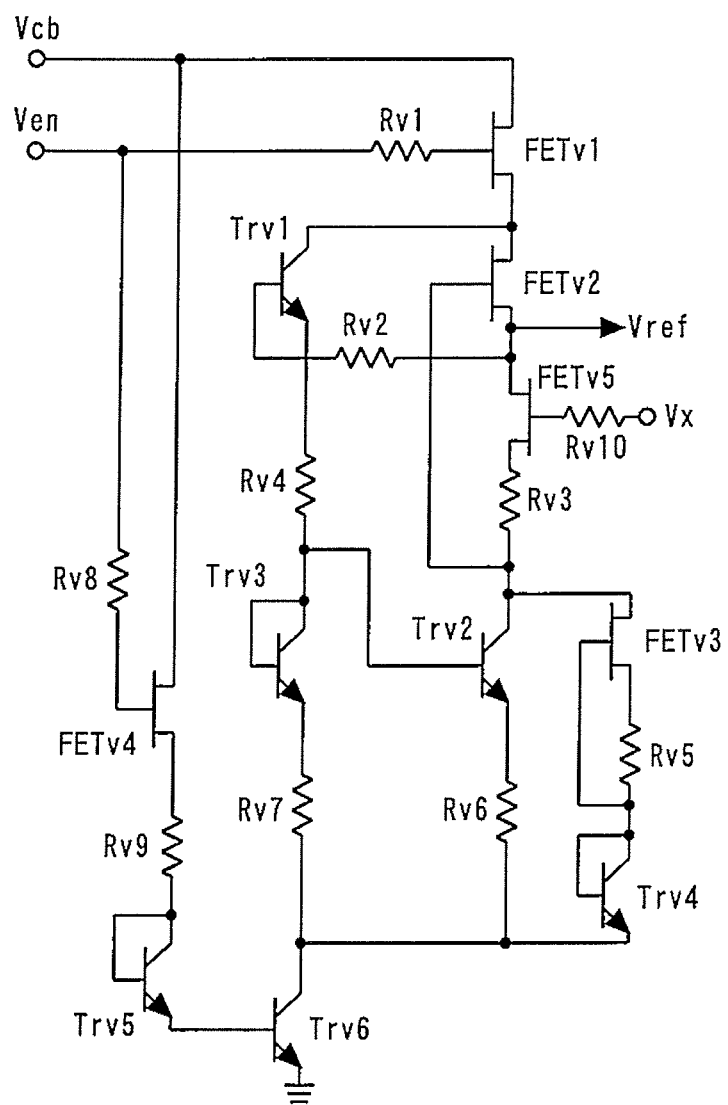
FIG. 4 is a circuit diagram showing a reference voltage generating circuit according to the first embodiment of the present invention.

FIG. 4 is a circuit diagram showing a reference voltage generating circuit according to the first embodiment of the present invention. Reference characters FETv11 to FETv4 denote depletion mode FETs, reference characters Trv1 to Trv6 denote HBTs, reference characters Rv1 to Rv10 denote resistors, reference character Vcb denotes a power terminal, reference character Ven denotes an enable terminal to which an enable voltage is applied, and reference character Vref denotes an output terminal from which a reference voltage is outputted. Reference character Vx denotes a signal terminal for controlling the FETv5.

The gate of the FETv1 is connected to the terminal Ven via the resistor Rv1, and the drain of the FETv1 is connected to the power terminal Vcb. The drain of the FETv2 is connected to the source of the FETv1. One end of the resistor Rv2 is connected to the source of the FETv2, and the other end of the resistor Rv2 is connected to the gate of the HBT Trv1. The collector of the HBT Trv1 is connected to the source of the FETv1. One end of the resistor Rv3 is connected to the gate of the FETv2 and the collector of the HBT Trv2. The base of the HBT Trv2 is connected to the emitter of the HBT Trv1 via the resistor Rv4. The base and the collector of the HBT Trv3 are connected to the base of the HBT Trv2 and the resistor Rv4. The resistor Rv6 is connected between the emitter of the HBT Trv2 and the collector of the HBT Trv6. The resistor Rv7 is connected between the emitter of the HBT Trv3 and the collector of the HBT Trv6. This reference voltage generating circuit outputs the source voltage of the FETv2 as a reference voltage from the output terminal Vref.

The FETv3, the resistor Rv5, and the HBT Trv4 constitute a circuit for compensating the variation of the thread value voltage of the FETv2, which is a depletion mode FET. The drain of the FETv3 is connected to one end of the resistor Rv3 and the collector of the HBT Trv2. The base and the collector of the HBT Trv4 are connected to the gate of the FETv3, and are connected to the source of the FETv3 via the resistor Rv5. The emitter of the HBT Trv4 is connected to the collector of the HBT Trv6. However, depending on the design, the resistor Rv5 can be omitted.

The FETv4, the HBT Trv5, the HBT Trv6, the resistor Rv8, and the resistor Rv9 constitute a circuit for preventing leakage. The gate of the FETv4 is connected to the terminal Ven via the resistor Rv8, the drain thereof is connected to the power terminal Vcb, and the emitter thereof is connected to the base and collector of the HBT Trv5 via the resistor Rv9. The emitter of the HBT Trv5 is connected to the base of the HBT Trv6, and the emitter of the HBT Trv6 is grounded.

As the feature of the present embodiment, the switch FETv5 is connected between the output terminal Vref and the resistor Rv3. In other words, the FETv5 is connected between the output terminal Vref and the grounding point. The gate of the FETv5 is connected to the control circuit 3 via the resistor Rv10 and the terminal Vx. The control circuit 3 controls the on/off of the FETv5.

Next, the operation of the reference voltage generating circuit 1 will be described. When the control signals of a high-level (reference voltage) are inputted from the control circuit 3 to the terminal Vx, the FETv5 is turned on, and the reference voltage generating circuit 1 operates normally. On the other hand, since the FETv5 is turned off when control signals of a low level (ca. 0.3 V or lower) are inputted from the control circuit 3 to the terminal Vx, no drain current of the FETv2 flows. In addition, since the reference voltage lowers than in operation, no collector current of the HBT Trv1 flows, either. Specifically, no current flows from the power terminal Vcb to the reference voltage generating circuit 1, and the reference voltage generating circuit 1 stops.

Figure 5:
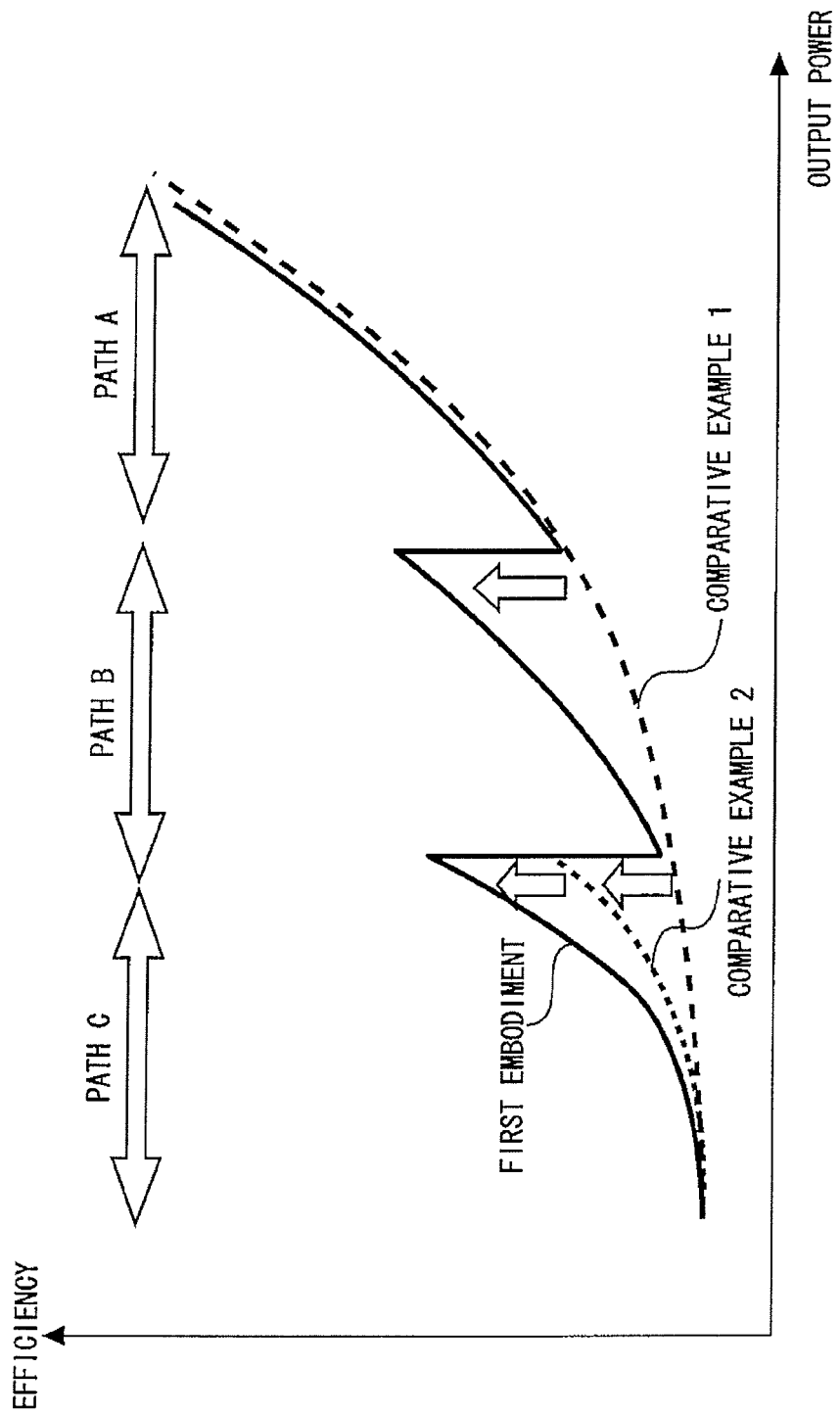
FIG. 5 is a graph showing the efficiencies of the power amplifier according to the first embodiment of the present invention and power amplifiers according to the comparative examples 1 and 2.

Next, the effect of the present embodiment will be described in comparison with comparative examples 1 and 2. FIG. 5 is a graph showing the efficiencies of the power amplifier according to the first embodiment of the present invention and power amplifiers according to the comparative examples 1 and 2. The comparative example 1 is the case when only the path A is used. The comparative example 2 is the case when an optimal path is selected depending on the output power level.

By selecting an optimal path by switching the switches SW1, SW2, and SW3 corresponding to the output power level as in the comparative example 2, the efficiencies in middle and low outputs can be improved comparing to the comparative example 1.

Furthermore in the present embodiment, not only the selection of the most optimal path, but also the reference voltage generating circuit 1 is stopped at the time of low output. Thereby, current consumption can be reduced, and the efficiency in low output can be further improved.

Here, the present inventors found that since the strain characteristics of the amplifier is improved at the time of low output, sufficient strain characteristics can be obtained even when the idle current of the amplifier transistor is not precisely controlled. Therefore, when limited to low output time, it was understood that the necessity to constantly maintain the reference voltage at high accuracy to the variation of power voltage is low. As a result, the reference voltage generating circuit 1 can be stopped at the time of low output.

Second Embodiment

Figure 6:
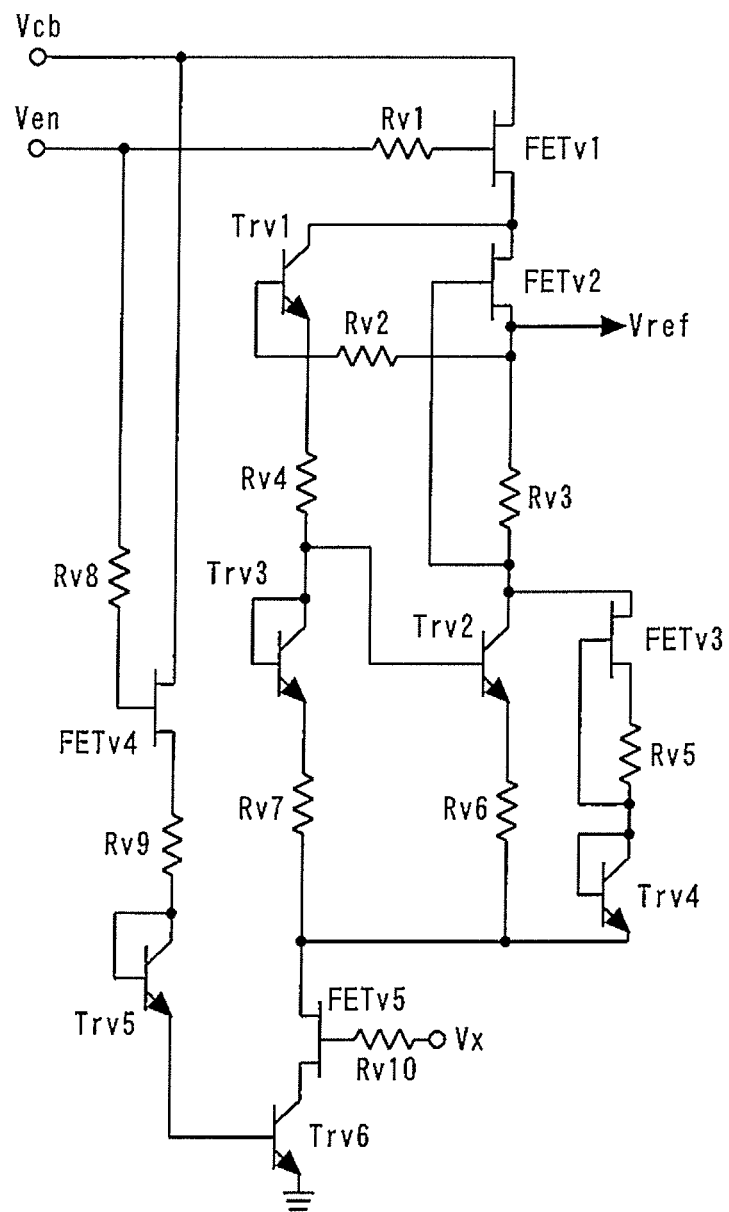
FIG. 6 is a circuit diagram showing a reference voltage generating circuit according to a second embodiment of the present invention.

FIG. 6 is a circuit diagram showing a reference voltage generating circuit according to a second embodiment of the present invention. In the present embodiment, the switch FETv5 that switches the operation of the reference voltage generating circuit 1 is inserted into the collector side of the HBT Trv6. The operation of the FETv5 is identical to the operation in the first embodiment. When the voltage Vx is controlled corresponding to the output power, the consuming current of the reference voltage generating circuit 1 can be reduced at the low-output time, and the effect similar to the effect of the first embodiment can be obtained.

Third Embodiment

Figure 7:
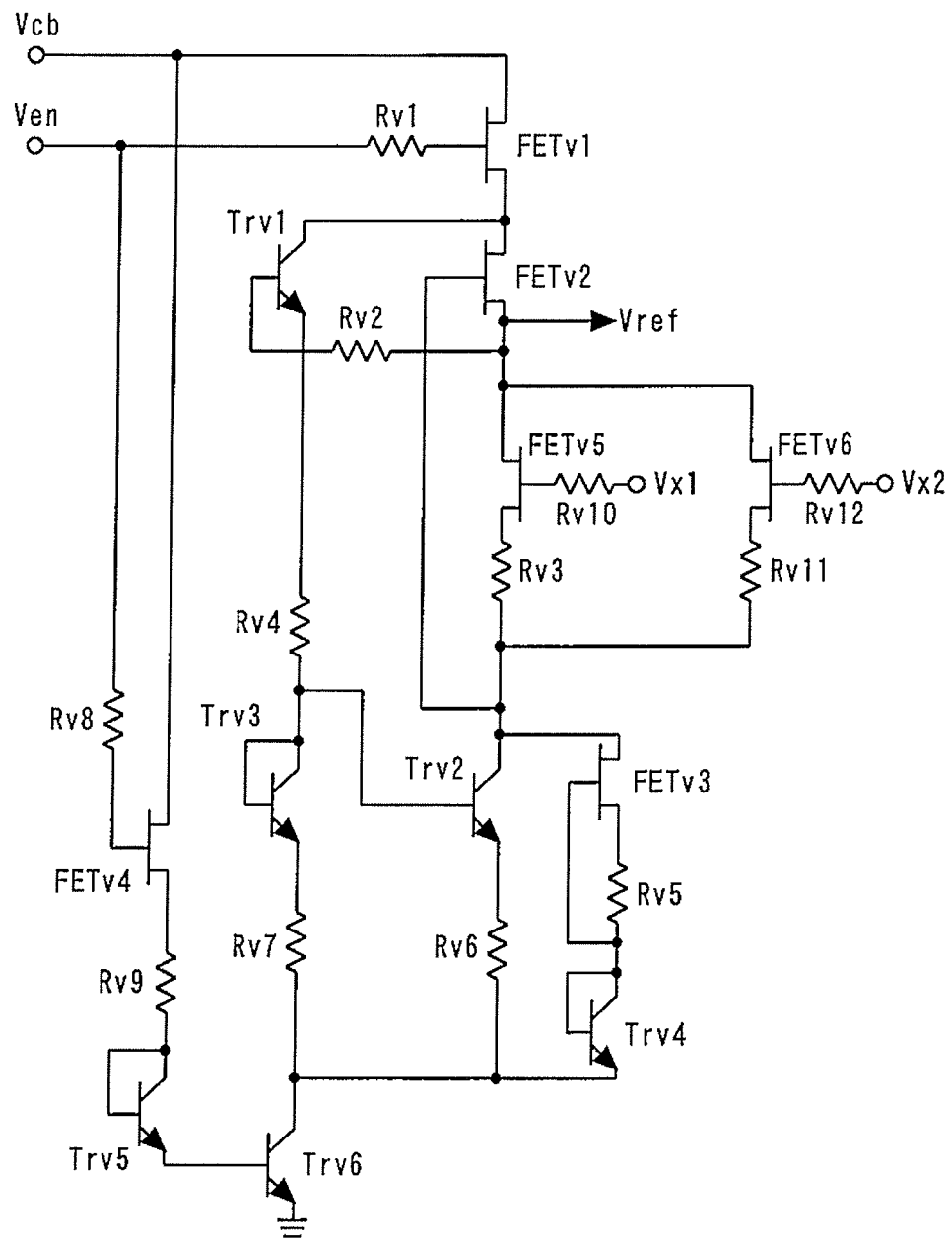
FIG. 7 is a circuit diagram showing a reference voltage generating circuit according to the third embodiment of the present invention.

FIG. 7 is a circuit diagram showing a reference voltage generating circuit according to the third embodiment of the present invention. Reference character FETv6 denotes a FET, reference characters Rv10 to Rv12 denote resistors, reference characters Vx1 and Vx2 denote signal terminals for controlling the FETv5 and FETv6, respectively.

The FETv6 is connected to the FETv5 in parallel. The resistor Rv11 is connected to the FETv6 in series. The gate of the FETv5 is connected to the control circuit 3 via the resistor Rv10 and the terminal Vx1, and the gate of the FETv6 is connected to the control circuit 3 via the resistor Rv12 and the terminal Vx2. The control circuit 3 controls on/off of the FETv5 and FETv6.

As described above, in the present embodiment, the two switches FETv5 and FETv6 that control the operation of the reference voltage generating circuit 1 are provided. In the reference voltage generating circuit 1, four states described below can be formed by the combination of control voltages to terminals Vx1 and Vx2.

Firstly, when the terminals Vx1 and Vx2 are Low, since both FETv5 and FETv6 become off, the reference voltage generating circuit 1 becomes off. Secondly, when the terminal Vx1 is High and the terminal Vx2 is Low, since the FETv5 is on and the FETv6 is off, the resistance value between the source of the FETv2 and the collector of the HBT Trv2 becomes the same as the resistance value at the resistor Rv3. Thirdly, when the terminal Vx1 is Low and the terminal Vx2 is High, since the FETv5 is off and the FETv6 is on, the resistance value between the source of the FETv2 and the collector of the HBT Trv2 becomes the same as the resistance value at the resistor Rv11. Fourthly, when the terminals Vx1 and Vx2 are High, since both FETv5 and FETv6 become on, the resistance value between the source of the FETv2 and the collector of the HBT Trv2 becomes the same as the resistance value when resistors Rv14 and Rv15 are connected in parallel.

When the resistance value between the source of the FETv2 and the collector of the HBT Trv2 is elevated, the reference voltage is lowered. Therefore, in the present embodiment, the resistance value can be changed by the combinations of the control voltages to the terminals Vx1 and Vx2, and three kinds of different reference voltages can be generated. In addition, in the case where the terminals Vx1 and Vx2 are Low, since the reference voltage generating circuit 1 can be turned off, the effects similar to the effect of the first embodiment can be obtained.

Fourth Embodiment

Figure 8:
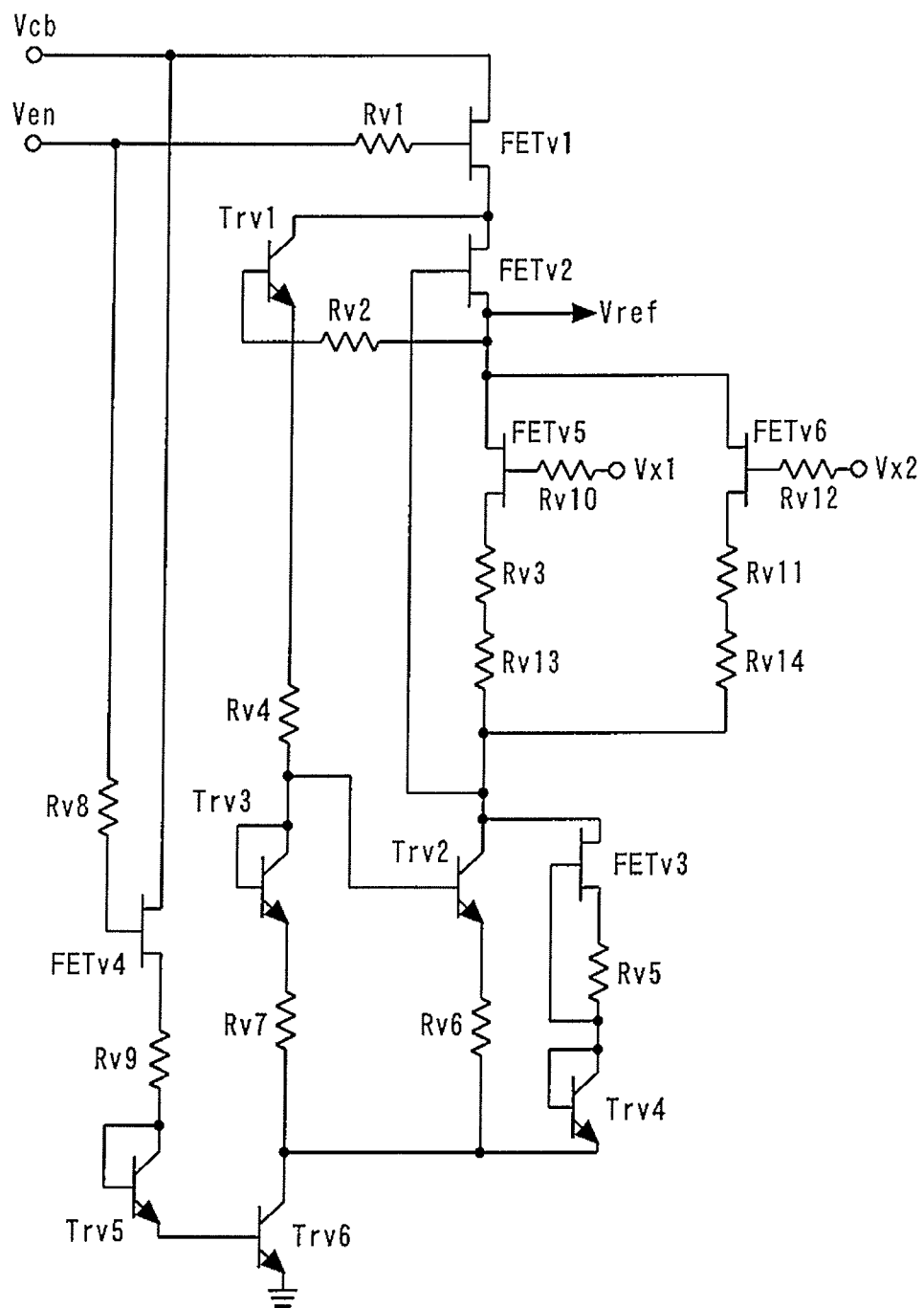
FIG. 8 is a circuit diagram showing a reference voltage generating circuit according to a fourth embodiment of the present invention.

FIG. 8 is a circuit diagram showing a reference voltage generating circuit according to a fourth embodiment of the present invention. A resistor Rv13 is connected to the FETv5 and the resistor Rv3 in series. The resistor Rv14 is connected to the FETv6 and the resistor Rv11 in series. The resistors Rv3 and Rv11 are resistors formed of a thin metal film (for example, NiCr), and the resistors Rv13 and Rv14 are resistors formed of a semiconductor layer (for example, a base layer).

Since the semiconductor resistor has a positive temperature coefficient, but the resistance value of the thin metal resistor does not depend on temperature, the temperature characteristics of the resistance value can be controlled by changing the ratio of the resistance value of the resistors Rv3 and Rv13 (the resistors Rv11 and Rv14 are also similar). Therefore, the temperature characteristics of the reference voltage can be controlled.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-059034, filed on Mar. 15, 2012, including specification, claims, drawings, and summary, on which the Convention priority of the present application is based, is incorporated herein by reference in its entirety.

What is claimed is:

1. A power amplifier comprising:
a first amplifying element amplifying an input signal;
a second amplifying element amplifying an output signal of the first amplifying element;
a third amplifying element amplifying the input signal;
a first switch connected between an output of the first amplifying element and an input of second amplifying element;
a second switch connected between an output of the first amplifying element and an output of the third amplifying element;
a third switch connected between an output of the first amplifying element and an output of the second amplifying element;
a reference voltage generating circuit generating a reference voltage;

a bias circuit supplying a bias current, based on the reference voltage and supplied to inputs of the first, second, and third amplifying elements; and a control circuit controlling the first, second and third switches and the reference voltage generating circuit, wherein, when the control circuit turns the first switch off and turns the second and third switches on, the control circuit stops the reference voltage generating circuit from generating the reference voltage.

2. The power amplifier according to claim 1, wherein
the reference voltage generating circuit includes
an output terminal outputting the reference voltage, and
a fourth switch connected between the output terminal and a grounding point, and
the control circuit controls the fourth switch.

3. The power amplifier according to claim 2, wherein
the reference voltage generating circuit includes
a first resistor connected in series with the fourth switch,
a fifth switch connected in parallel with the fourth switch, and
a second resistor connected in series with the fifth switch, and
the control circuit controls the fifth switch.

4. The power amplifier according to claim 3, wherein
the reference voltage generating circuit includes
a third resistor connected in series with the fourth switch and the first resistor, and
a fourth resistor connected in series with the fifth switch and the second resistor,
the first and second resistors are semiconductor resistors, and
the third and fourth resistors are thin metal resistors.

* * * * *